(12) United States Patent
Awad et al.

(10) Patent No.: US 9,815,701 B1
(45) Date of Patent: Nov. 14, 2017

(54) SYNTHESIS OF REDUCED GRAPHENE OXIDE NANOPARTICLES

(71) Applicant: KING SAUD UNIVERSITY, Riyadh (SA)

(72) Inventors: Manal Ahmed Gasmelseed Awad, Riyadh (SA); Awatif Ahmed Hendi, Riyadh (SA); Khalid Mustafa Osman Ortashi, Riyadh (SA); Amel Laref, Riyadh (SA); Nawal Ahmad Madkhali, Riyadh (SA); Hajar Abdullah Aldakhil, Riyadh (SA); Fatimah Yahya Mohammad Al-Abbas, Riyadh (SA); Lena Jassim, Riyadh (SA)

(73) Assignee: KING SAUD UNIVERSITY, Riyadh (SA)

( * ) Notice: Subject to any disclaimer, the term of this patent is extended or adjusted under 35 U.S.C. 154(b) by 0 days.

(21) Appl. No.: 15/442,606

(22) Filed: Feb. 24, 2017

(51) Int. Cl.
| | | |
|---|---|---|
| *C01B 31/02* | (2006.01) | |
| *H01B 1/04* | (2006.01) | |
| *C01B 31/04* | (2006.01) | |
| *H01L 31/0224* | (2006.01) | |
| *H01L 33/42* | (2010.01) | |
| *G01N 27/414* | (2006.01) | |

(52) U.S. Cl.
CPC ....... *C01B 31/043* (2013.01); *G01N 27/4145* (2013.01); *H01B 1/04* (2013.01); *H01L 31/022466* (2013.01); *H01L 33/42* (2013.01); *C01P 2002/72* (2013.01); *C01P 2004/62* (2013.01); *C01P 2004/64* (2013.01); *C01P 2006/40* (2013.01)

(58) Field of Classification Search
CPC . C01B 31/0476; C01B 31/04; C01B 31/0423; B82Y 30/00; B82Y 40/00
USPC .......... 252/502, 506, 500; 423/415.1, 445 B, 423/448, 460, 445 R; 977/895, 900
See application file for complete search history.

(56) References Cited

U.S. PATENT DOCUMENTS

| 8,865,113 B2 | 10/2014 | Shankman | |
|---|---|---|---|
| 2012/0129736 A1 | 5/2012 | Tour et al. | |
| 2014/0079932 A1* | 3/2014 | Aksay .................... | B82Y 30/00 428/219 |
| 2014/0134092 A1* | 5/2014 | Shankman ............. | B82Y 30/00 423/415.1 |
| 2014/0147368 A1 | 5/2014 | Ting et al. | |

FOREIGN PATENT DOCUMENTS

CN 104157850 * 6/2015 ............. H01M 4/36

OTHER PUBLICATIONS

Akhavan ("Synthesis of graphene from natural and industrial carbonaceous wastes." RSC Advances, 4, pp. 20441-20448, pub 2014).*
Deng ("Transforming waste into carbon-based nanomaterials." Carbon 96, pp. 105-115, online Sep. 10, 2015).*

* cited by examiner

*Primary Examiner* — Tri V Nguyen
(74) *Attorney, Agent, or Firm* — Richard C. Litman

(57) ABSTRACT

The synthesis of reduced graphene oxide nanoparticles includes the steps of: mixing soot with an acid to obtain a solution; adding a first oxidant gradually into the solution to oxidize the carbon source and obtain a suspension; stirring the suspension while maintaining a temperature of the suspension at about 35° C.; raising the temperature of the suspension to about 60° C.; adding water into the solution; adding a second oxidant into the suspension while stirring resulting in the oxidation of the carbon source to form the reduced graphene oxide nanoparticles; and isolating the resulting reduced graphene oxide nanoparticles by centrifugation. The acid is preferably an acid mixture including, for example, sulfuric acid ($H_2SO_4$) and phosphoric acid ($H_3PO_4$). The first and second oxidants can be potassium permanganate ($KMnO_4$) or hydrogen peroxide ($H_2O_2$).

2 Claims, 9 Drawing Sheets

SYNTHESIS OF REDUCED GRAPHENE OXIDE NANOPARTICLES

BACKGROUND OF THE INVENTION

1. Field of the Invention

The present invention relates to nanoparticles, and particularly to the synthesis of reduced graphene oxide (rGO) nanoparticles.

2. Description of the Related Art

Graphene oxide (GO) has two important characteristics: (1) it can be produced using inexpensive graphite as raw material by cost-effective chemical methods with a high yield, and (2) it is highly hydrophilic and can form stable aqueous colloids to facilitate the assembly of macroscopic structures by simple and cheap solution processes, both of which are important to the large-scale uses of graphene.

Graphene exhibits excellent mechanical, electrical, thermal and optical properties. It can be produced by micromechanical exfoliation of highly ordered pyrolytic graphite, epitaxial growth, chemical vapor deposition, and the reduction of graphene oxide (GO). The first three methods can produce graphene with a relatively perfect structure and excellent properties. Due to its remarkable physical, chemical, and mechanical properties, and with a view to important applications, graphene has been emerging as one of the areas of research attracting great interest in academia and industry. Recently, graphene has attracted much attention in the scientific community for its numerous potential applications in biotechnology, including bio-sensing, disease diagnostics, anti-bacteria and antiviral materials, cancer targeting, photo-thermal therapy, drug delivery, and tissue engineering.

Thus, the synthesis of reduced graphene oxide (rGO) nanoparticles solving the aforementioned problems is desired.

SUMMARY OF THE INVENTION

The synthesis of reduced graphene oxide nanoparticles includes the steps of: mixing soot with at least one acid to obtain a solution; adding a first oxidant to the solution to oxidize the carbon source and obtain a suspension; stirring the suspension while maintaining a temperature of the suspension at about 35° C.; raising the temperature of the suspension to about 60° C.; adding water to the suspension; adding a second oxidant to the suspension while stirring to form the reduced graphene oxide nanoparticles; and isolating the resulting reduced graphene oxide nanoparticles by centrifugation. The acid is preferably an acid mixture including, for example, sulfuric acid ($H_2SO_4$) and phosphoric acid ($H_3PO_4$). The first and second oxidants can include potassium permanganate ($KMnO_4$) or hydrogen peroxide ($H_2O_2$).

A light transparent electrode for solar cells and light emitting diodes can include the reduced graphene oxide nanoparticles.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
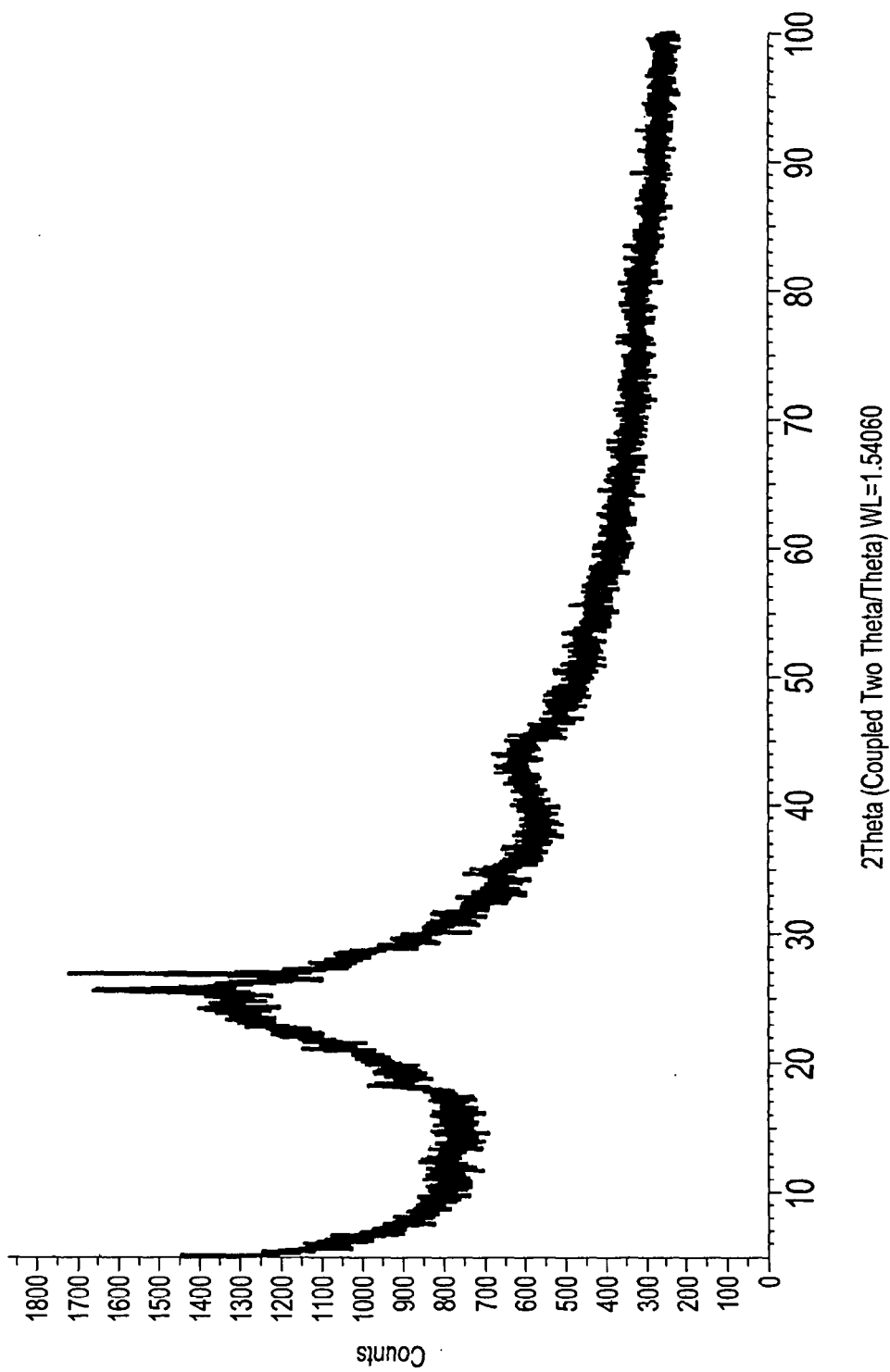
FIG. 1 is an exemplary X-ray diffraction pattern of reduced graphene oxide nanoparticles produced according to the method of the present invention.

The synthesis of reduced graphene oxide nanoparticles includes the steps of: mixing a carbon source with an acid to obtain a solution; adding a first oxidant gradually into the solution to oxidize the carbon source and obtain a suspension; stirring the suspension while maintaining a temperature of the suspension at about 35° C.; raising the temperature of the suspension to about 60° C.; adding water to the suspension; adding a second oxidant into the suspension while stirring resulting in the oxidation of the carbon source to form the reduced graphene oxide nanoparticles; and isolating the resulting reduced graphene oxide nanoparticles by centrifugation. The carbon source can be soot. The acid is preferably an acid mixture including, for example, sulfuric acid ($H_2SO_4$) and phosphoric acid ($H_3PO_4$). The first and second oxidants can be potassium permanganate ($KMnO_4$) or hydrogen peroxide ($H_2O_2$). For example, the first oxidant can be $KMnO_4$ and the second oxidant can be $H_2O_2$. The reduced graphene oxide nanoparticles can be washed with deionized water and 5% HCl solution and dried, for example, at a temperature of about 100° C.

The carbon source for preparing the reduced graphene oxide (rGO) nanoparticles can be soot, for example, soot formed during baking of bread or other food items in a wood-fired oven, grill, or griddle, for example. For example, the soot can be obtained from the griddle that is used to prepare Abray, a traditional Sudanese drink.

The reduced graphene oxide nanoparticles have a mean diameter in the range of from about 1 nm to about 200 nm across the largest dimension. For example, the average particle size for the rGO individual nanoparticles can be about 174.2 nm. The reduced graphene oxide nanoparticles can have one or more shapes selected from the group consisting of spherical-shaped, spheroidal-shaped, elongated/spherical shaped, rod-shaped and faceted shaped. The reduced graphene oxide nanoparticles typically display a resistance of $10^8$ to $10^{10}$ Ohm.

The term "Graphene" refers to an atom-thick monolayer of carbon atoms arranged in a two dimensional honeycomb structure, and is a basic building block for other graphitic materials, such as graphite and carbon nanotubes.

The method of producing reduced graphene oxide (rGO) nanoparticles includes a modified Hummer method, and is a simple, cost effective, and affordable method. This method can easily be scaled up for large scale synthesis. Thus, the above examples illustrate a simple, non-toxic, cost-effective, quick, and environmentally friendly synthesis approach for the reduced graphene oxide nanoparticles.

The reduced graphene oxide nanoparticles have multiple applications. For example, several electronic devices have been fabricated using graphene oxide (GO) as a starting material for at least one of the components. One such device is a graphene based field effect transistor (GFET). Field effect transistors (FETs) that employ reduced graphene oxide (rGO) have been used as chemical sensors and biosensors also in biomedical applications. GFETs that use functionalized rGO as the semiconductor have been used as biosensors to detect hormonal catecholamine molecules, avid in, and DNA. In another study, GO that was functionalized with glucose oxidase and deposited on an electrode was used as an electrochemical glucose sensor. Visible light transparent electrodes are important for both light emitting diodes (LEDs) and solar cell devices. Since GO can be processed in solution, using rGO as a transparent electrode is a convenient alternative to other transparent electrodes such as ITO for these devices. In addition to being a transparent electrode, rGO has been used as a whole transport layer in polymer solar cells and LEDs, in addition to applications in energy storage.

The present teachings will be understood more readily by reference to the following examples, which are provided by way of illustration.

Example 1

Synthesis of Reduced Graphene Oxide (rGO) Nanoparticles

Soot, formed during baking of Abray, was collected from the griddle. Abray is a local and traditional paste used as drink during the month of Ramadan in Sudan. During the process of baking sheets of Abray, the residue of burning coal, wood, papers, etc., formed the soot which attached under the grill or griddle. Then, after the grill or griddle cooled down the soot from the grill, was collected, softly crushed, and stored until used.

About 2.5 g of the soot was mixed with 54 mL $H_2SO_4$ and 6 mL $H_3PO_4$ and stirred for 5 min. Next, 8 g of potassium permanganate, $KMnO_4$, was very slowly added to provide a suspension. The suspension was again stirred at 35° C. for 10 min. The temperature of the mixture was adjusted to a constant 60° C. for 15 min while water was added continuously. Deionized water was further added so that the volume of the suspension was 150 mL. Then, about 8 mL of $H_2O_2$ was added after 5 min. The reaction product was centrifuged and washed with deionized water and 5% HCl solution repeatedly. Finally, the product was dried at 100° C.

The produced nanoparticles was characterized by transmission electron microscopy (JEM-1011, JEOL, Japan) in addition to X-ray diffractometer (XRD), Bruker D8 ADVANCE, while the size of synthesized nanoparticles was analyzed through Zetasizer, Nano series, HT Laser, ZEN3600 (Molvern Instrument, UK).

Figure 2:
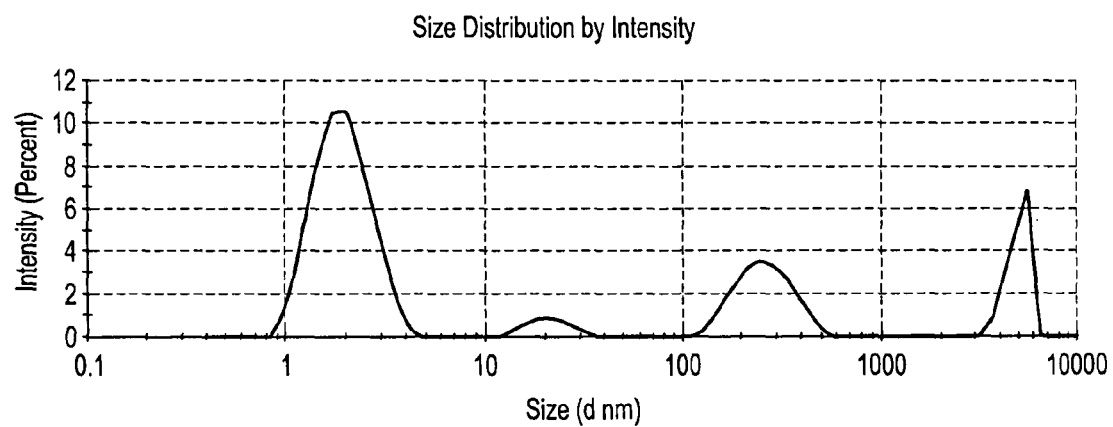
FIG. 2 is a Zetasizer plot showing particle size distribution of the reduced graphene oxide nanoparticles produced according to the method of the present invention.
Figure 3A:
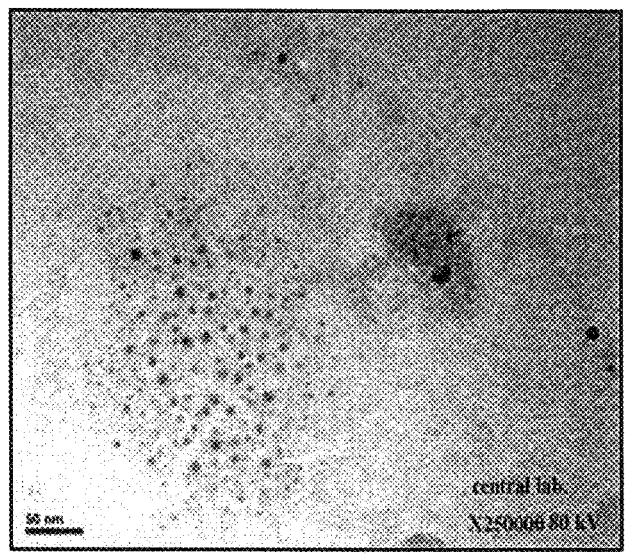
FIGS. 3A, 3B, 3C and 3D are transmission electron micrographs (TEM) of the reduced graphene oxide nanoparticles produced according to the method of the present invention.
Figure 3B:
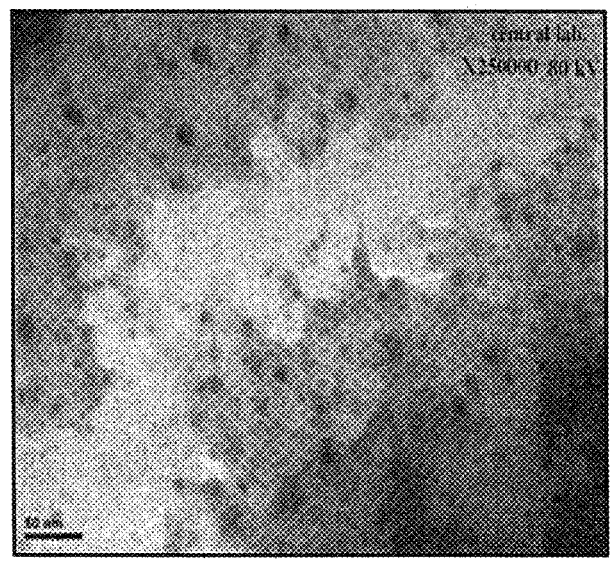
Figure 3C:
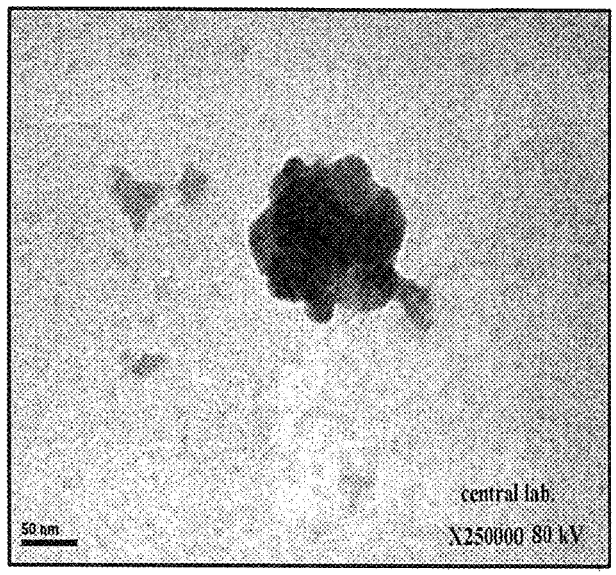
Figure 3D:
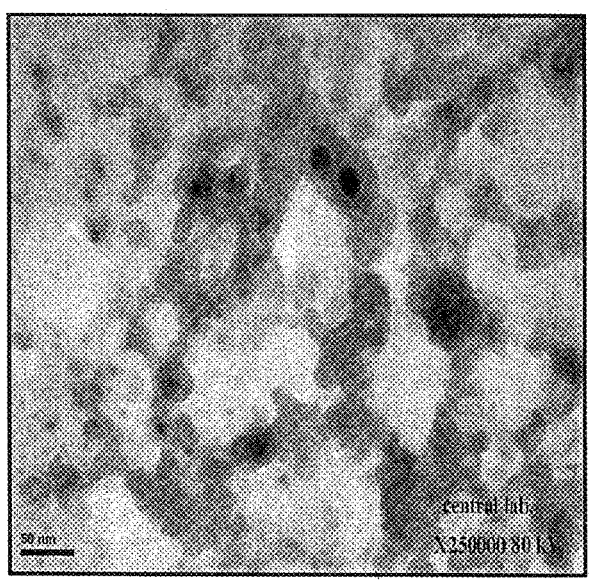
Figure 4A:
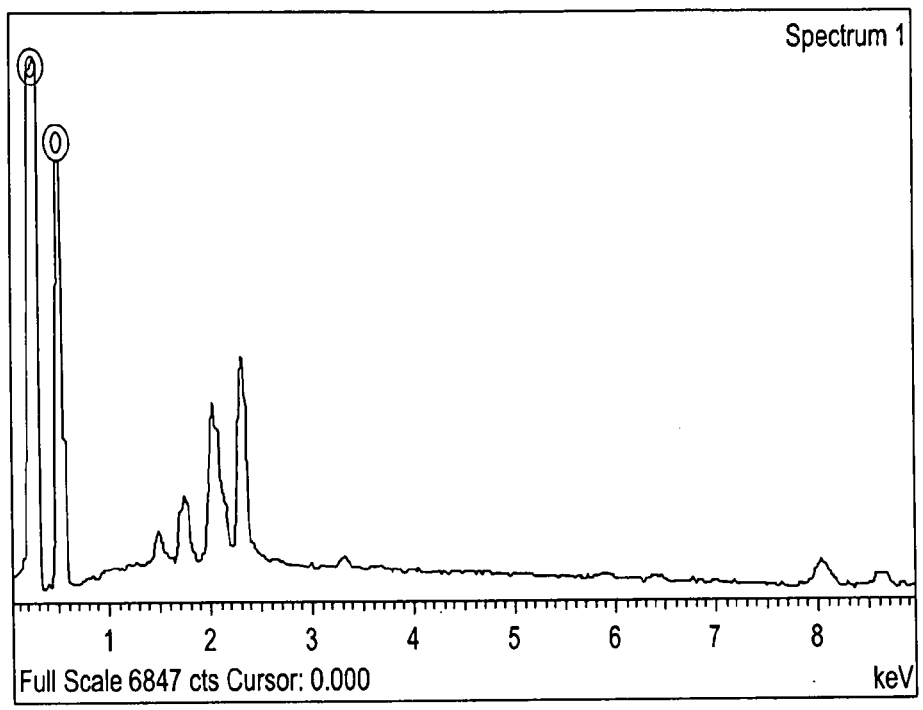
FIG. 4A shows the Energy-dispersive X-ray spectroscopy (EDX) pattern of the reduced graphene oxide nanoparticles produced according to the method of the present invention.
Figure 4B:
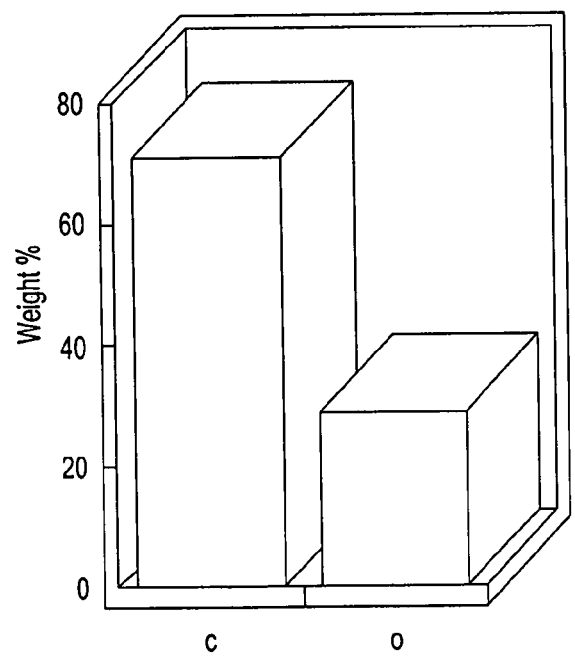
FIG. 4B is a graph representing the elemental analysis for the reduced graphene oxide nanoparticles, showing two dominant peaks for carbon and oxygen.

FIG. 1 shows the X-ray diffraction (XRD) pattern of the reduced graphene oxide (rGO) nanoparticles. FIG. 2 shows the particle size distribution of the reduced graphene oxide particles. The peaks, having Z-average sizes of about 2.0 nm (peak 1), 269.3 nm (peak 2), and 4990 nm (peak 3), having intensities of about 61.3%, 20.4% and 14.5%, respectively were found. The average particle size for the rGO individual nanoparticles is 174.2 nm as shown in FIG. 2. The 2θ values for these peaks appear at 20.003, 21.55 and 25.133 respectively. FIGS. 3A-D show the transmission electron microscopy (TEM) images of the reduced graphene oxide nanoparticles. The particles appear to be spherical or elongated spherical, with a dimension of about 1 nm to 200 nm. FIG. 4A shows the Energy-dispersive X-ray spectroscopy (EDX) pattern of rGO nanoparticles with two dominant peaks for carbon and oxygen respectively. The elemental analysis of the rGO indicates the presence of carbon and oxygen, as shown in FIG. 4B.

The reduced graphene oxide (rGO) nanoparticles powder were pressed into disk in a steel device using ERWEKA, Apparatebau GmbH, Heusenstamm, Germany for pressing tablets. The electrical parameters measured for the disk-shaped samples were in the frequency range of 20 Hz up to 1 MHz, using a WAYNE KERR precision component analyzer, model 6440 B (UK). The sample cell had two squared platinum black electrodes each having an area of 1×1 cm² with an inner electrode distance of 1 cm. The measurements were performed at room temperature. For a dielectric material placed between two parallel plate capacitors, the measured values of capacitance (C) and resistance (R) were used to calculate the real part ($\epsilon'$) and imaginary part ($\epsilon''$) of the complex permittivity $\epsilon^* = \epsilon' - j\epsilon''$, while conductivity ($\sigma$) and the relaxation time ($\tau$) were calculated using the following equations:

1) $\epsilon^* = \epsilon_o C \kappa$; $\kappa = 1$ cm$^{-1}$, where $\kappa$ is the cell constant which depends on the cell $\kappa$ dimensions;

2) Loss tangent:

$$\tan\delta = \frac{\varepsilon''}{\varepsilon'} = \frac{1}{2\pi f RC}$$

so, $\epsilon'' = \epsilon'$ tan δ;

3) The conductivity $$\sigma = \frac{k}{R}(\Omega^{-1}\ m^{-1});$$

and

4) Relaxation time $$(\tau) = \frac{1}{2\pi f_c},$$

where, ($f_c$) is the critical frequency corresponding to the mid-point of the dispersion curve.

If any dielectric material is introduced between the two plates, the corresponding response to a sinusoidal field will be characterized by dielectric properties (dielectric permittivity ($\epsilon$) and conductivity ($\sigma$) which vary with frequency). The charge and current densities induced in response to an applied electric field is an example of an idealized parallel plate.

The various applications of graphene depends on the variation of electrical conductivity. The graphene oxide has non-conductive behavior, since the existence of sp³ bonds are additional besides to the high density electronegative oxygen atoms. The conductivity must be tunable for its applications. In this perspective, the graphene oxide based devices could have potential applications in environment as a gas sensor. The graphene oxide could behave as sensing channel and main working of gas sensor which relies on the charge/electron transfer between adsorbed gas and graphene oxide sheet. Overall, based on the measurement of the resistance/conductivity variation of the graphene oxide with different gases, the presence of the gas would be obtained. Using ac-measurements results, the resistance of rGO varying from 108 to 1010 Ohm at high frequency shows the reduction of rGO could be p-type semiconductor. In this case, the electrons could be extracted or injected from rGO and hence the conductivity of rGO could vary. It is feasible that rGO may have various usages in environmental and energy applications, as sensors and batteries.

Figure 5:
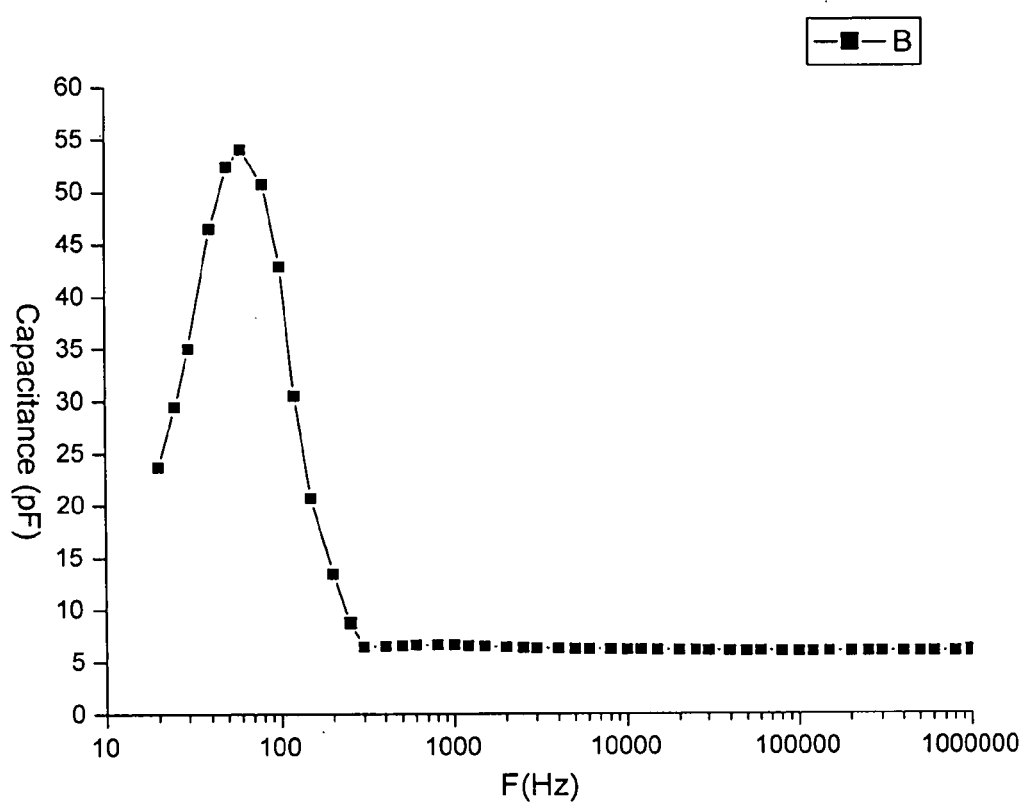
FIG. 5 is a graph showing capacitance as a function of the applied frequency in the frequency range of 20 Hz to 1 MHz for rGO nanoparticles.

FIG. 5 displays the charge/discharge curve of the capacitors at low and high frequencies. The capacity behavior at low frequencies, a series-RC circuit model is employed to show the capacity and resistance components of the capacitor. The capacitance of the capacitor increases from 23 to 55 pF as the frequency increases from 15 to 90 Hz. The change of the behavior of capacitance happens at τ0 and is the minimum time required to discharge all the energy from the device, and can be deduced from the frequency at maximum C. In the lower frequency section, the capacitance is enhanced considerably and then drops.

Figure 6:
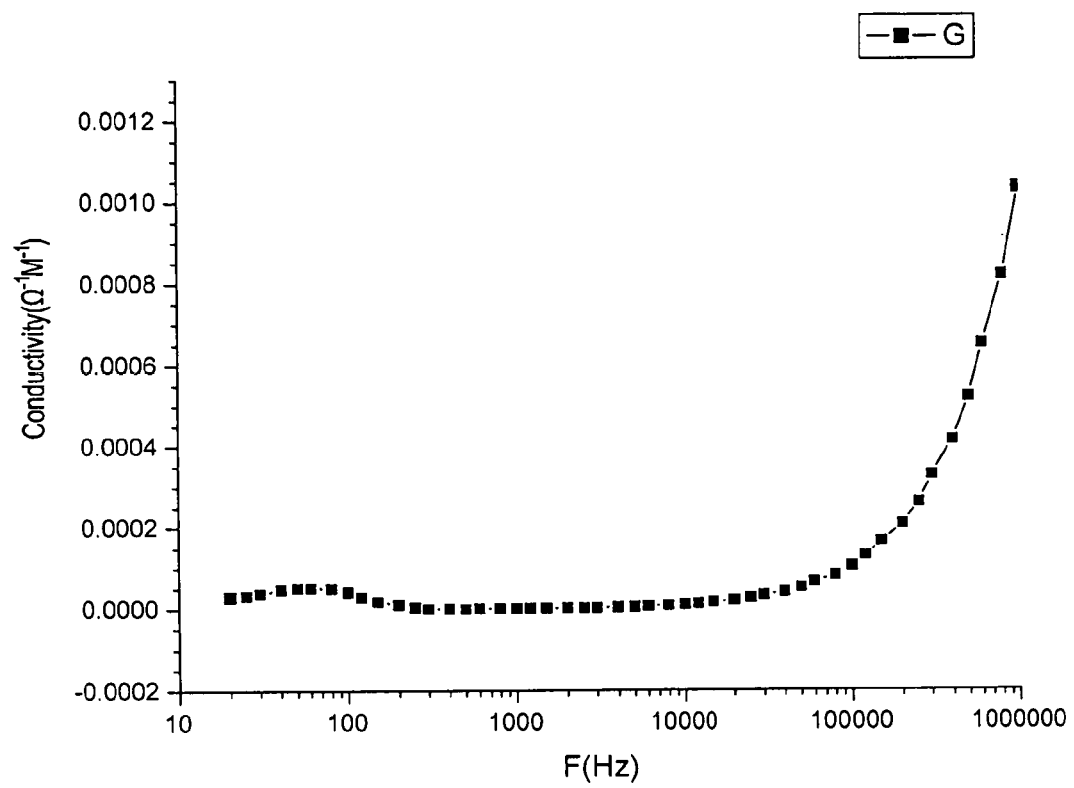
FIG. 6 is a graph showing the electrical conductivity as a function of the applied frequency in the frequency range of 20 Hz to 1 MHz for rGO nanoparticles.

FIG. 6 displays the electrical conductivity as a function of the applied frequency in the frequency range of 20 Hz to 1 MHz for the rGO nanoparticles. The dependence of AC conductivity versus different frequencies shows an increase at high frequencies around $10^5$ Hz after being almost constant at low frequencies. The conductivity curve shows a strong dependence on frequency owing to their semiconducting behavior at low frequencies. A transition from semiconducting to metal could happen at high frequencies between $10^4$ to $10^6$ HZ.

Figure 7:
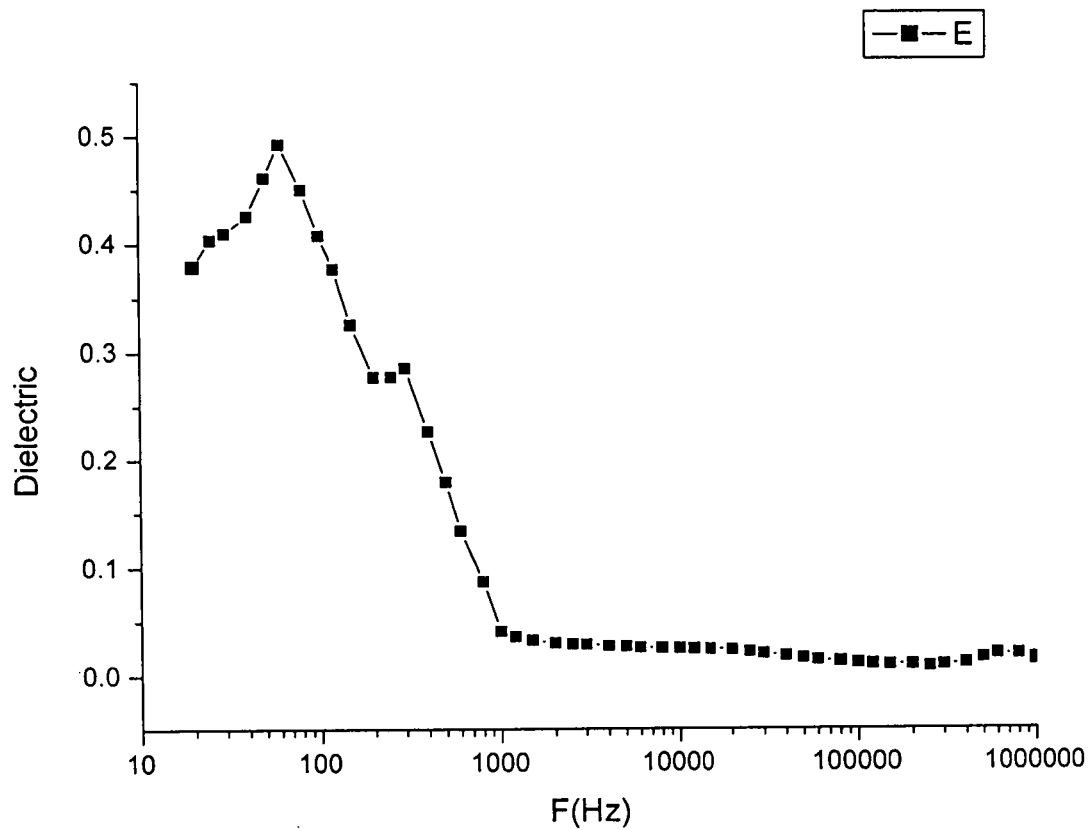
FIG. 7 is a plot of the dielectric as a function of the applied frequency in the frequency range of 20 Hz to 1 MHz for rGO nanoparticles

FIG. 7 shows the dielectric as a function of the applied frequency in the frequency range of 20 Hz to 1 MHz for rGO nanoparticles. As shown in FIG. 7, the dielectric loss is principally due to the leakage of the current in rGO. The change of dielectric constant is connected to the electrical conductivity.

Figure 8:
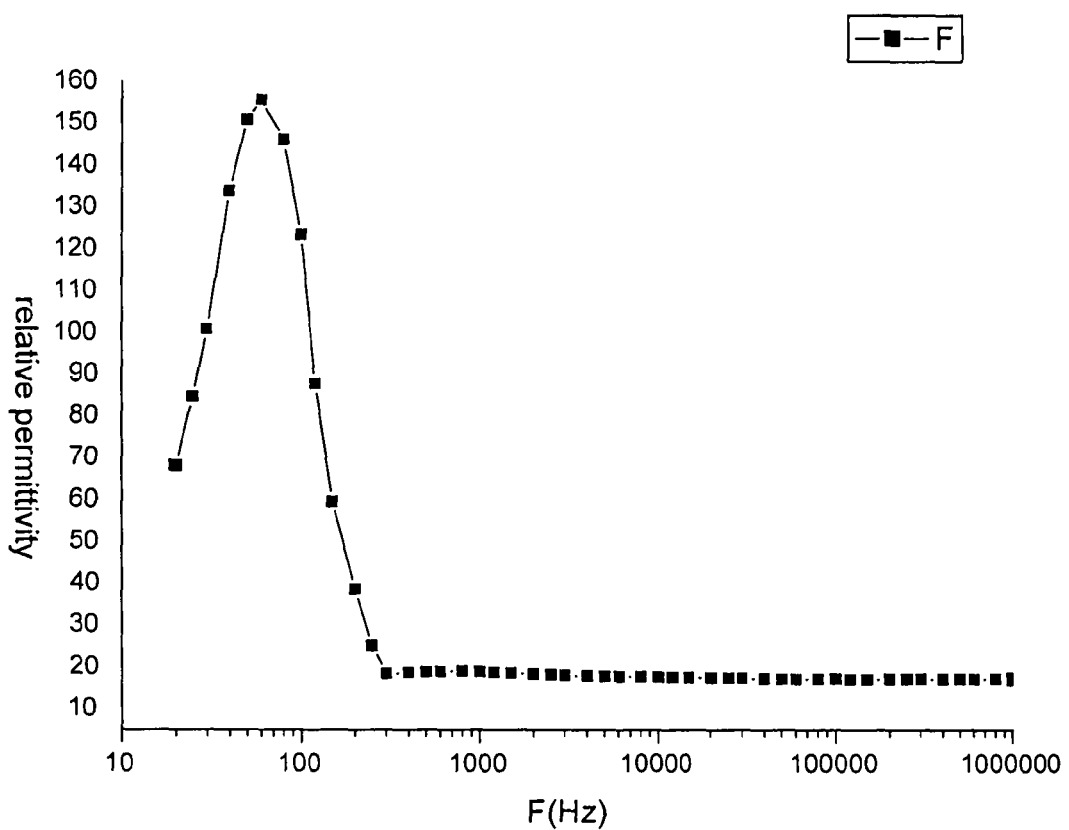
FIG. 8 is a plot of relative permittivity as a function of the applied frequency in the frequency range of 20 Hz to 1 MHz for rGO nanoparticles.

FIG. 8 shows the relative permittivity as a function of the applied frequency in the frequency range of 20 Hz to 1 MHz for rGO nanoparticles. The dielectric permittivity shows an increase at low frequencies around 100 Hz, whereas an abrupt decrease appears which could be due to the motion of free charge carriers and the formation of a conductive state in rGO. Frequently, the increase in dielectric constant could be associated with the increase of dielectric loss. Thus, the total capacitance is governed by the effect of rGO, and is the main factor to affect the dielectric constant. The loss factor is usually employed as a measure of the energy dissipation in a dielectric system.

It is to be understood that the present invention is not limited to the embodiments described above, but encompasses any and all embodiments within the scope of the following claims.

We claim:

1. A method for synthesizing reduced graphene oxide, comprising the steps of:
    selecting a carbonaceous material, wherein the carbonaceous material consists of soot obtained directly from the residual soot formed on cooking grills;
    mixing the soot with at least one acid to obtain a solution;
    adding a first oxidant to the solution to provide a suspension, wherein the first oxidant is potassium permanganate;
    stirring the suspension while maintaining a temperature of the suspension at about 35° C. for 10 minutes;
    raising the temperature of the suspension to a constant 60° C. for 15 minutes while adding deionized water to the suspension;
    adding a second oxidant to the suspension to provide reduced graphene oxide nanoparticles, wherein the second oxidant is hydrogen peroxide;
    isolating the reduced graphene oxide nanoparticles, wherein the reduced graphene oxide nanoparticles are isolated by centrifugation; and
    washing the reduced graphene oxide nanoparticles with deionized water and 5% HCl solution and drying the nanoparticles at about 100° C.

2. The method for synthesizing reduced graphene oxide nanoparticles according to claim 1, wherein the at least one acid comprises an acid mixture including sulfuric acid and phosphoric acid.

* * * * *